United States Patent
Incarbone et al.

(10) Patent No.: US 10,690,712 B2
(45) Date of Patent: Jun. 23, 2020

(54) METHOD FOR DETECTING SOFT FAULTS IN A CABLE, WHICH METHOD IS BASED ON THE INTEGRAL OF A REFLECTOGRAM

(71) Applicant: COMMISSARIAT A L'ENERGIE ATOMIQUE ET AUX ENERGIES ALTERNATIVES, Paris (FR)

(72) Inventors: Luca Incarbone, Biel/Bienne (CH); Miguel Gallego Roman, Paris (FR)

(73) Assignee: COMMISSARIAT A'LENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 53 days.

(21) Appl. No.: 16/081,410

(22) PCT Filed: Feb. 22, 2017

(86) PCT No.: PCT/EP2017/053973
§ 371 (c)(1),
(2) Date: Aug. 30, 2018

(87) PCT Pub. No.: WO2017/148753
PCT Pub. Date: Sep. 8, 2017

(65) Prior Publication Data
US 2019/0094289 A1    Mar. 28, 2019

(30) Foreign Application Priority Data
Mar. 1, 2016   (FR) ..................... 16 51702

(51) Int. Cl.
*G01R 31/11*   (2006.01)
*G01R 31/08*   (2020.01)

(52) U.S. Cl.
CPC .......... *G01R 31/11* (2013.01); *G01R 31/085* (2013.01)

(58) Field of Classification Search
CPC ... G01R 31/088; G01R 31/083; G01R 31/021
See application file for complete search history.

(56) References Cited

U.S. PATENT DOCUMENTS

| 2003/0125893 A1 | 7/2003 | Furse |
| 2004/0189317 A1* | 9/2004 | Borchert ............ G01R 31/3275 324/512 |

(Continued)

FOREIGN PATENT DOCUMENTS

| FR | 1 459 402 A | 4/1966 |
| FR | 1 554 632 A | 1/1969 |

(Continued)

OTHER PUBLICATIONS

Sahmarany, "Méthodes d'amélioration pour le diagnostic de câble par réflectométrie", Université Blaise Pascal—Clermont-Ferrand II, pp. 1-196, Dec. 17, 2013.

(Continued)

*Primary Examiner* — Alvaro E Fortich
(74) *Attorney, Agent, or Firm* — Baker & Hostetler LLP

(57) ABSTRACT

A method for detecting soft faults in a transmission line includes the steps of: acquiring a time-domain reflectogram, calculating the integral of the time-domain reflectogram, selecting, in the integral, three samples $P_1$, $P_2$, $P_3$, calculating a first distance equal to the difference in absolute value between the value of the second sample $P_2$ and the value of the first sample $P_1$ or of the third sample $P_3$, calculating a second distance equal to the difference in absolute value between the value of the first sample $P_1$ and of the third sample $P_3$, performing a first comparison of the first distance to the second distance weighted by a weighting coefficient $\beta$, deducing from the result of the first comparison information on the existence of a soft fault.

14 Claims, 5 Drawing Sheets

(56) References Cited

U.S. PATENT DOCUMENTS

| | | | |
|---|---|---|---|
| 2005/0238037 A1* | 10/2005 | Dodds | H04L 43/50 370/420 |
| 2006/0038573 A1* | 2/2006 | Sarkozi | G01R 31/1272 324/536 |
| 2006/0039322 A1 | 2/2006 | Furse et al. | |
| 2009/0012727 A1* | 1/2009 | Siew | G01R 31/088 702/59 |
| 2011/0187381 A1 | 8/2011 | Ems et al. | |
| 2014/0316726 A1* | 10/2014 | Franchet | G01R 31/11 702/59 |
| 2015/0117634 A1* | 4/2015 | Dardenne | H04M 3/08 379/380 |
| 2015/0253370 A1 | 9/2015 | Fantoni | |

FOREIGN PATENT DOCUMENTS

| | | |
|---|---|---|
| FR | 2 981 752 A1 | 4/2013 |
| FR | 2 988 855 A1 | 10/2013 |
| FR | 3 006 769 A1 | 12/2014 |
| GB | 1 275 374 A | 5/1972 |
| KR | 101 403 346 B1 | 6/2014 |
| WO | 2013/034565 A1 | 3/2013 |
| WO | 2013/057131 A1 | 4/2013 |
| WO | 2016/050547 A1 | 4/2016 |

OTHER PUBLICATIONS

Furse, et al., "Noise-domain reflectometry for locating wiring faults", IEEE Transactions on Electromagnetic Compatibility, vol. 47, Issue: 1, pp. 97-104, Feb. 1, 2005.

Smith, et al., "Analysis of spread spectrum time domain reflectometry for wire fault location", IEEE Sensors Journal, vol. 5, Issue: 6, pp. 1469-1478, Dec. 1, 2005.

Geiger, et al., "Low-cost high-resolution time-domain reflectometry for monitoring the range of reflective points", Journal of Lightwave Technology, vol. 13, Issue: 7, pp. 1282-1288, Jul. 1, 1995.

Andrews, "Automatic network measurements in the time domain", Proceedings of the IEEE, vol. 66, Issue: 4, pp. 114-423, Apr. 1, 1978.

Biesen, et al., "High accuracy location of faults on electrical lines using digital signal processing", IEEE Transactions on Instrumentation and Measurement, vol. 39, Issue: 1, pp. 175-179, Feb. 1, 1990.

Pintelon, et al., "Identification of transfer functions with time delay and its application to cable fault location", IEEE Transactions on Instrumentation and Measurement, vol. 39, Issue: 3, pp. 479-484, Jun. 1, 1990.

Abboud, et al., "Utilization of matched pulses to improve fault detection in wire networks", International Conference on Its Telecommunications, pp. 543-548, Oct. 20, 2009.

* cited by examiner

METHOD FOR DETECTING SOFT FAULTS IN A CABLE, WHICH METHOD IS BASED ON THE INTEGRAL OF A REFLECTOGRAM

CROSS-REFERENCE TO RELATED APPLICATIONS

This application is a National Stage of International patent application PCT/EP2017/053973, filed on Feb. 22, 2017, which claims priority to foreign French patent application No. FR 1651702, filed on Mar. 1, 2016, the disclosures of which are incorporated by reference in their entirety.

FIELD OF THE INVENTION

The invention relates to the field of wired diagnostics systems based on the principle of reflectometry. Its subject is a method for detecting soft faults in a cable, based on use of the integral of a reflectogram.

BACKGROUND

Cables are omnipresent in all electrical systems, for supplying or transmitting information. These cables are subject to the same stresses as the systems that they link and can be subject to failures. It is therefore necessary to be able to analyze their condition and provide information on the detection of faults, but also the location and type thereof, in order to assist in maintenance. The standard reflectometry methods allow for this type of testing.

The reflectometry methods use a principle similar to that of radar: an electrical signal, the probe signal or reference signal, which is more often than not high-frequency or wideband, is injected at one or more points of the cable to be tested. The signal is propagated in the cable or the network and returns a portion of its energy when it encounters an electrical discontinuity. An electrical discontinuity can result, for example, from a connection, from the end of the cable or from a fault or, more generally, from a break in the conditions of propagation of the signal in the cable. It results more often than not from a fault which locally alters the characteristic impedance of the cable by provoking a discontinuity in its line parameters.

The analysis of the signals returned to the injection point makes it possible to deduce therefrom information on the presence and on the location of these discontinuities, therefore of any faults. An analysis in the time or frequency domain is usually performed. These methods are referred to by the acronyms TDR, from the expression "time domain reflectometry", and FDR, from the expression "frequency domain reflectometry".

The invention falls within the scope of the reflectometry methods for wired diagnostics and applies to any type of electrical cable, in particular power transmission cables or communication cables, in fixed or mobile installations. The cables concerned can be coaxial, two-wired, in parallel lines, in twisted pairs or the like, provided that it is possible to inject therein a reflectometry signal at a point of the cable and measure its reflection at the same point or at another point.

The known time-domain reflectometry methods are particularly suited to the detection of hard faults in a cable, such as a short-circuit or an open-circuit or, more generally, a significant local alteration of the impedance of the cable. The detection of the fault is done by measuring the amplitude of the signal reflected on this fault which is all the greater and therefore detectable when the fault is significant.

Conversely, a soft fault, for example resulting from a superficial degradation of the cladding of the cable, of the insulation or of the conductor, generates a peak of low amplitude on the reflected reflectometry signal and is consequently more difficult to detect by conventional time-domain methods. More generally, a soft fault can be provoked by a friction, a pinching or even a corrosion phenomenon affecting the cladding of the cable, the insulation or the conductor.

The detection and the location of a soft fault on a cable is a major problem for the industrial world because a fault generally appears first as a superficial fault but can, over time, evolve to a fault with greater impact. For this reason in particular, it is useful to be able to detect the appearance of a fault as soon as it appears and at a stage where its impact is superficial in order to anticipate its evolution to a greater fault.

The low amplitude of the reflections associated with the passage of the signal through a soft fault also creates a potential false detection problem. Indeed, it can be difficult to discriminate a peak of low amplitude in a reflectogram which may result either from a fault on the cable, or from a measurement noise. Thus, false positives can appear which do not correspond to faults but which result from the measurement noise or from non-uniformities of the cable.

The prior art includes several methods for detecting soft faults based on the principle of reflectometry.

The French patent application from the Applicant published under the number FR2981752 proposes a method for post-processing of a reflectogram based on the mathematical Wigner-Ville transform. The method consists of a time-frequency analysis of the reflectogram in order to emphasize the components corresponding to the faults sought. One drawback with this method is its high complexity for embedded equipment.

The French patent application from the Applicant published under the number FR3006769 proposes a different approach based on a processing of the signal measured in the frequency domain in order to estimate certain characteristic parameters of the propagation of the signal in the cable. The detection of soft faults is done by analyzing the parameters estimated.

Also known are the French patent applications from the Applicant filed respectively under the numbers FR1459402 and FR1554632. The first proposes a method for auto-adaptive correlation between the reflected signal and the injected signal while the second focuses on a search for zero-crossings of the reflectogram and a comparison of the power of the signal calculated on either side of the zero-crossing. The method called subtractive correlation described in the document "Méthodes d'amélioration pour le diagnostic de câble par réflectométrie" [Enhancement methods for cable diagnostics by reflectometry], Lola El Sahmarany, Université Blaise Pascal—Clermont-Ferrand II, 2013, can also be cited.

These latter methods offer better results for the detection of soft faults but can however generate a not-inconsiderable number of false detections or false positives because of the difficulty in discriminating the peaks of low amplitude associated with the faults and those associated with measurement noise or with inherent non-uniformities of the cable.

The invention proposes a novel method for detecting soft faults which is based on a post-processing applied to the integral of the measured reflectogram.

SUMMARY OF THE INVENTION

The invention offers the advantage of limiting the false detections and of not being difficult to implement, thus facilitating its implementation in an embedded device.

Thus, the subject of the invention is a method for detecting soft faults in a transmission line comprising the following steps:

- acquiring a measurement signal, called time-domain reflectogram, characteristic of the reflection of a reference signal previously injected into the line,
- calculating the integral of the time-domain reflectogram,
- selecting, from the samples of the integral of the time-domain reflectogram, a first sample $P_1$, a second sample $P_2$, delayed by a first delay $k_1$ relative to the first sample $P_1$ and a third sample $P_3$, delayed by a second delay $k_2$ relative to the second sample $P_2$,
- calculating a first distance equal to the difference in absolute value between the value of the second sample $P_2$ and the value of either one of the first sample $P_1$ or of the third sample $P_3$,
- calculating a second distance equal to the difference in absolute value between the value of the first sample $P_1$ and of the third sample $P_3$,
- performing a first comparison of the first distance to the second distance weighted by a weighting coefficient $\beta$,
- deducing from the result of the first comparison information on the existence of a soft fault at a position of the cable corresponding to the time-domain abscissa of the second sample $P_2$.

According to a particular embodiment, the method according to the invention further comprises the following steps:

- performing a second comparison of the first distance to a detection threshold $\alpha$,
- deducing from the result of the first comparison and of the second comparison information on the existence of a soft fault at a position of the cable corresponding to the time-domain abscissa of the second sample $P_2$.

According to a particular aspect of the invention, the first delay $k_1$ and the second delay $k_2$ are determined at least as a function of the width of the first mismatch peak measured on the time-domain reflectogram.

According to a particular aspect of the invention, the method is iterated by varying the first sample $P_1$ over a plurality of samples of the integral of the time-domain reflectogram by retaining the values of the first delay $k_1$ and of the second delay $k_2$ that are fixed during the iterations.

According to a particular aspect of the invention, the first delay $k_1$ is equal to the second delay $k_2$.

According to a particular aspect of the invention, the detection threshold $\alpha$ is configured at least as a function of a parameter out of the signal-to-noise ratio on the first signal r(t) and the severity of the targeted soft fault.

According to a particular aspect of the invention, the value of the weighting coefficient $\beta$ is taken from the interval [3; 9].

According to a particular aspect of the invention, the time-domain reflectogram is replaced by the cross-correlation between the first measurement signal r(t) and the reference signal s(t).

According to a particular embodiment, the method according to the invention comprises a diagnostic step of concluding on the presence of a soft fault at a position of the cable corresponding to the time-domain abscissa of the second sample $P_2$ if the first distance is greater than the detection threshold $\alpha$ and if the first distance is greater than the second distance weighted by the weighting coefficient $\beta$.

According to a particular embodiment, the method according to the invention comprises a diagnostic step of concluding on the absence of a soft fault at a position of the cable corresponding to the time-domain abscissa of the second sample $P_2$ if the first distance is less than the detection threshold $\alpha$ and if the first distance is less than the second distance weighted by the weighting coefficient $\beta$.

Another subject of the invention is a device for detecting soft faults in a cable comprising an apparatus for measuring, at a point of the cable, a signal back-propagated in the cable and a computer configured to execute the method for detecting soft faults in a cable according to the invention.

Another subject of the invention is a reflectometry system comprising a device for injecting, at a point of the cable, a reference signal, and a device for detecting soft faults in a cable according to the invention.

Another subject of the invention is a computer program comprising instructions for the execution of the method for detecting soft faults in a cable according to the invention, when the program is run by a processor.

Another subject of the invention is a processor-readable storage medium on which is stored a program comprising instructions for the execution of the method for detecting soft faults in a cable according to the invention, when the program is run by a processor.

BRIEF DESCRIPTION OF THE DRAWINGS

Other features and advantages of the present invention will become more apparent on reading the following description in relation to the attached drawings which represent.

DETAILED DESCRIPTION

A soft fault generally introduces a local alteration of the electrical characteristics of a transmission line, for example of a cable. The physical degradation, however superficial, of the line leads in particular to a local alteration of the characteristic impedance of the cable, which leads to an alteration of the reflection coefficient at the point of the fault.

The term soft fault here targets any fault superficially affecting a cable so as to locally create a variation of the characteristic impedance. In particular, such faults include a scratch or wear of the cladding, of the dielectric, but also the start of degradation of the metal conductor, the compression of a cable, friction or even corrosion. These degradations can, first of all, seem benign and without significant repercussions for the system. However, if nothing is done, the mechanical and environmental stresses or even the aging of the cable will cause a soft fault to evolve to a hard fault, whose consequences, both economic and in terms of hardware, can be considerable. Detecting incipient faults allows for a better management of the maintenance and therefore a reduction of repair costs.

Figure 1:
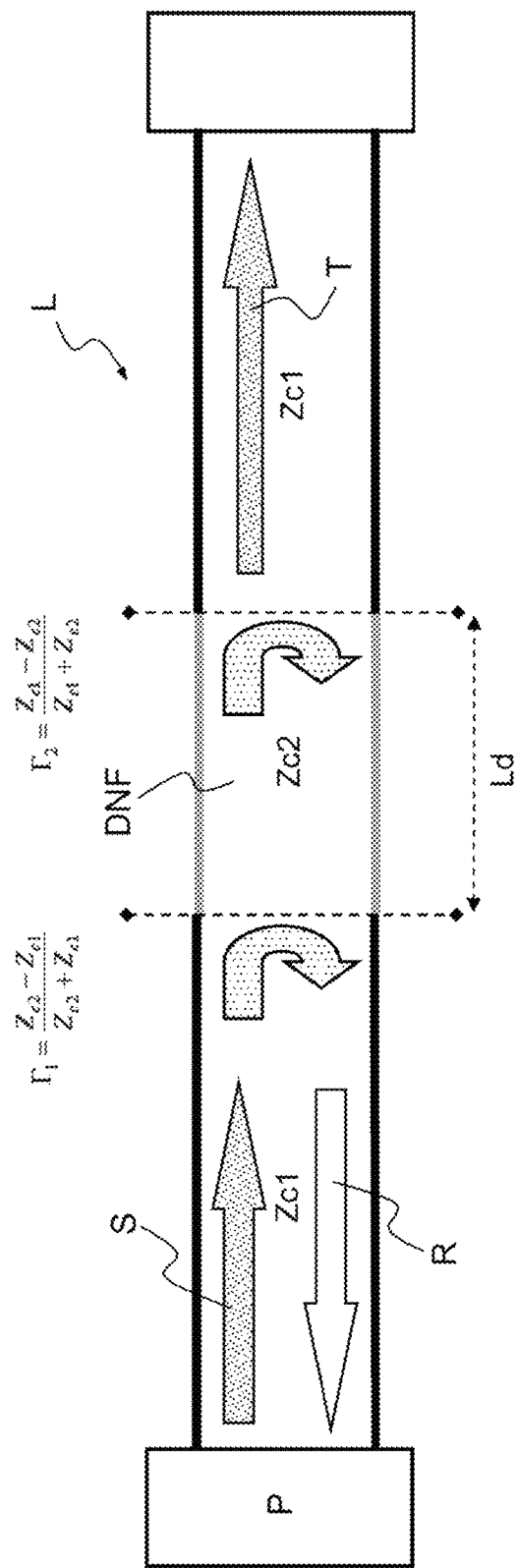
FIG. 1, a diagram illustrating the known principle of time-domain reflectometry and its application to the detection of a soft fault, FIG. 2, an example of reflectogram illustrating the appearance of the signature of a soft fault, FIG. 3, a flow diagram detailing the steps of implementation of the method according to the invention, FIGS. 4a, 4b, 4c, several diagrams illustrating certain steps of the method according to the invention, FIG. 5, a diagram of an exemplary embodiment of a device for detecting soft faults according to the invention.

FIG. 1 schematically represents the principle of operation of a reflectometry diagnostic method applied to a transmission line L exhibiting a soft fault DNF.

A reference signal S is injected into the transmission line at a point P. The reflected signal R is measured at the same point P (or at another point of the line). This signal is propagated in the line and encounters, in its propagation, a first impedance discontinuity on entering the soft fault DNF. The signal is reflected on this discontinuity with a reflection coefficient $\Gamma_1$. If the characteristic impedance $Z_{c2}$ in the area of the soft fault DNF is less than the characteristic impedance $Z_{c1}$ before the appearance of the fault, then the reflection coefficient $\Gamma_1$ is negative and is reflected by a peak of negative amplitude in the reflected signal R. In the reverse case, the reflection coefficient $\Gamma_1$ is positive and is reflected by a peak of positive amplitude in the reflected signal R.

The transmitted part T of the incident signal S continues to be propagated in the line and then encounters a second impedance discontinuity creating a second reflection of the incident signal with a reflection coefficient $\Gamma_2$ of a sign opposite to the first reflection coefficient $\Gamma_1$. If $\Gamma_1<0$ then $\Gamma_2>0$. If $\Gamma_1>0$ then $\Gamma_2<0$.

Figure 2:
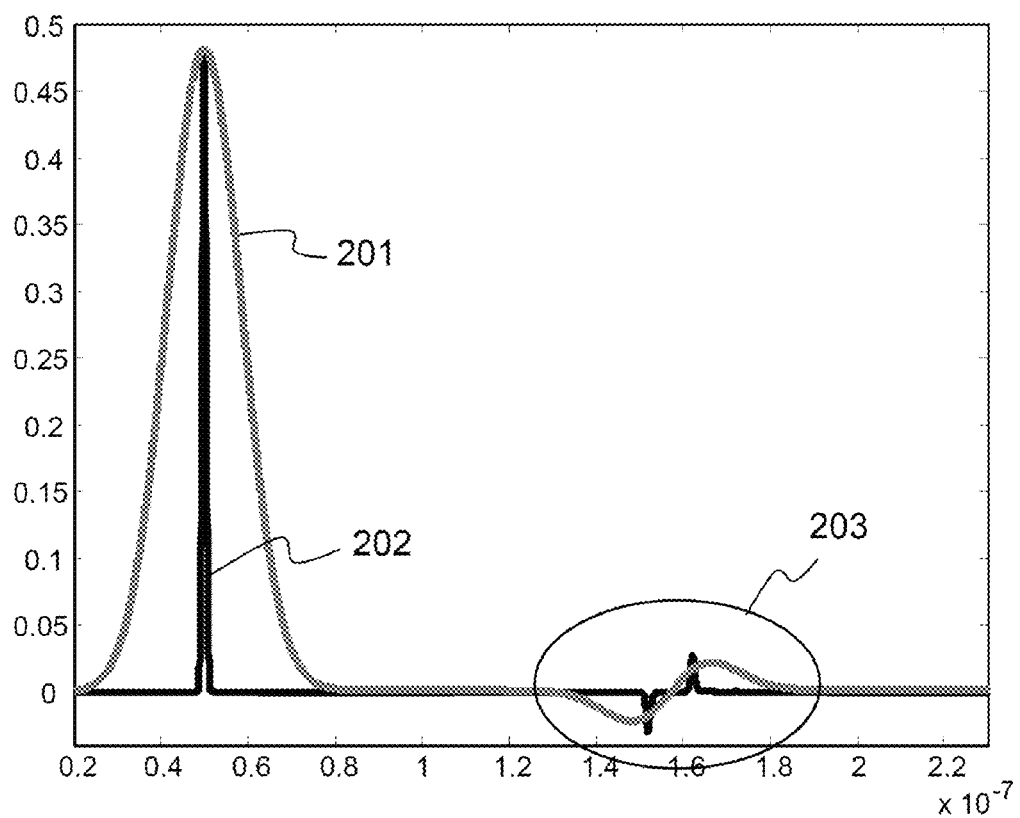

Thus, by observing the reflected signal R, the signature of the soft fault DNF is characterized by two successive peaks of reversed signs as shown in FIG. 2.

FIG. 2 represents a time-domain reflectogram which corresponds either directly to the measurement of the reflected signal R, or to the cross-correlation between the reflected signal R and the signal injected into the cable S.

In the case where the injected reference signal is a time-domain pulse, the reflectogram can correspond directly to the measurement of the reflected signal R. In the case where the injected reference signal is a more complex signal, then the reflectogram is obtained by cross-correlating the reflected signal R and the injected signal S.

FIG. 2 shows two reflectograms 201, 202 corresponding to two different pulse durations for the signal injected into the cable. The curve 201 corresponds to a pulse duration $2 \cdot \Delta T$ very much greater than the time it takes for the signal to cross the soft fault DNF. The length of the fault being denoted Ld, this duration has the value Ld/V, with V the speed of propagation of the signal in the cable. The curve 202 corresponds to a pulse duration $2 \cdot \Delta T$ very much less than the time it takes for the signal to cross the soft fault DNF.

In both cases, the signature 203 of the soft fault, in the reflectogram, is still made up of the succession of a first peak and of a second peak whose signs are reversed. This property is exploited by the invention to enhance the detection of such faults.

The distance between the two peaks represents the length of the soft fault and their amplitude represents the severity of the soft fault. Indeed, the greater the variation of the characteristic impedance, the greater also is the amplitude of the signature of the soft fault in the reflectogram.

As is known in the field of reflectometry diagnostic methods, the position dDNF of the soft fault on the cable, in other words its distance to the point P of injection of the signal, can be directly obtained from the measurement, on the time-domain reflectogram of FIG. 2, of the duration $t_{DNF}$ between the first amplitude peak recorded on the reflectogram (at the abscissa 0.5 in the example of FIG. 2) and the amplitude peak 203 corresponding to the signature of the soft fault.

Various known methods can be considered for determining the position $d_{DNF}$. A first method consists in applying the relationship linking distance and time: $d_{DNF}=V \cdot t_{DNF}$ where V is the speed of propagation of the signal in the cable. Another possible method consists in applying a proportionality relationship of the type $d_{DNF}/t_{DNF}=L/t_0$ where L is the length of the cable and $t_0$ is the duration, measured on the reflectogram, between the amplitude peak corresponding to the impedance discontinuity at the point of injection and the amplitude peak corresponding to the reflection of the signal on the end of the cable.

Figure 3:
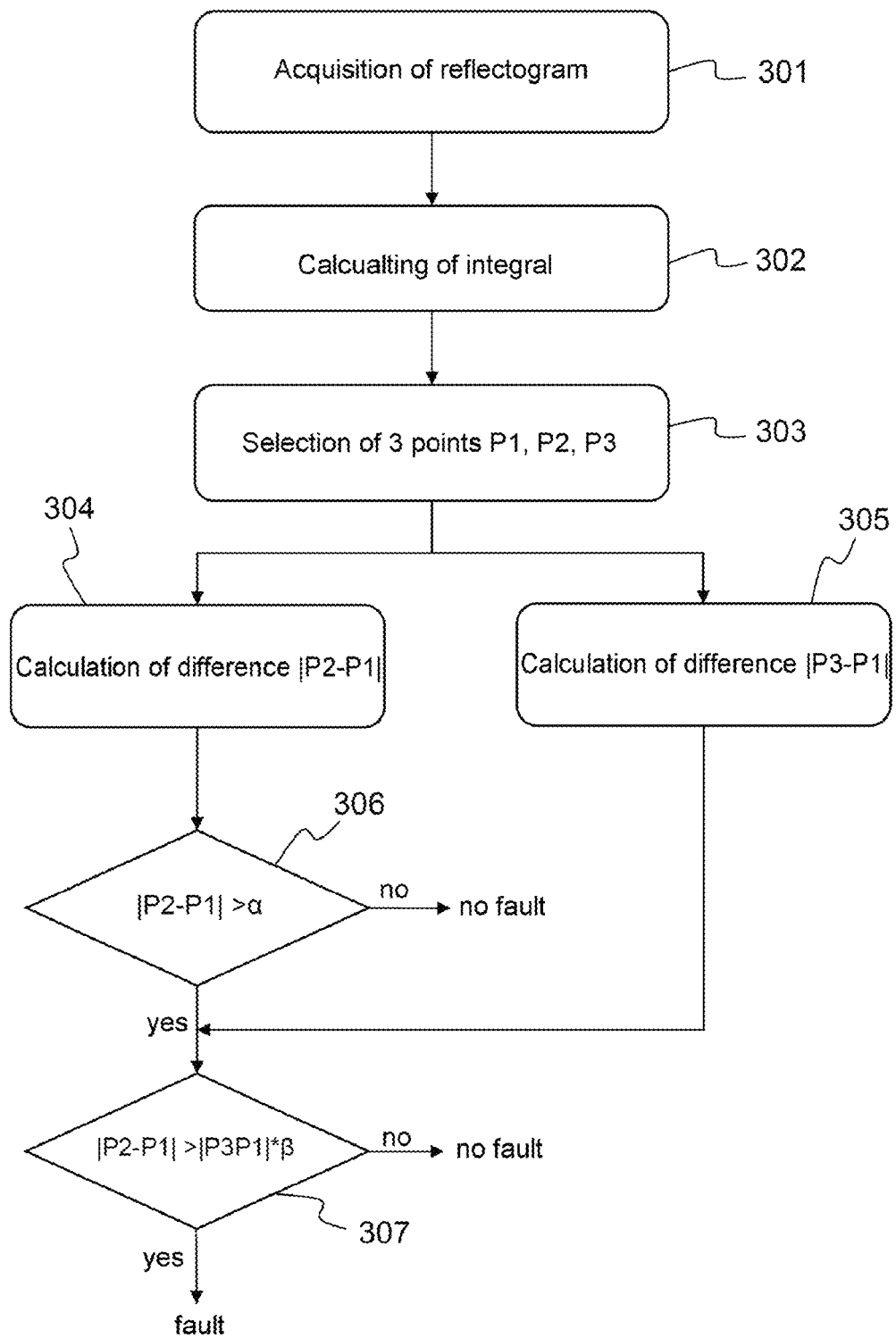

FIG. 3 details the steps of implementation of the method for detecting soft faults according to the invention.

The method according to the invention is applied to a time-domain reflectogram which reflects the reflections of a reference signal injected into the cable, on the impedance discontinuities that it encounters in its propagation. The nature of the reflectogram depends on the type of reference signal envisaged. Generally, whatever the form of the signal, the reflectogram can be obtained from a measurement of the signal back-propagated in the cable, then a cross-correlation of this measurement with the reference signal which was injected into the cable. In the case where the reference signal used is a time-domain pulse, for example a pulse of Gaussian form, the step of cross-correlation of the measurement with the reference signal is not necessary.

Thus, the method begins with the acquisition or the construction 301 of a time-domain reflectogram from at least one measurement of a signal back-propagated in the cable.

Figure 4A:
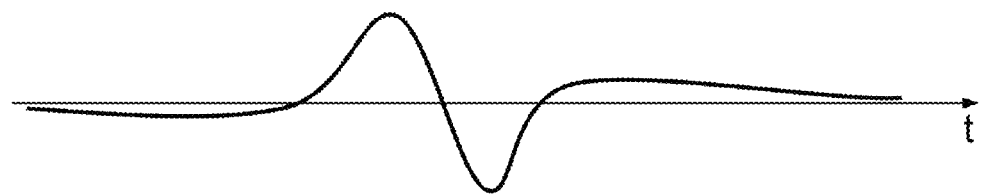

An example of time-domain reflectogram is represented in FIG. 4a. This reflectogram comprises a signature characteristic of a soft fault comprising a first peak of positive sign followed by a second peak of opposite negative sign and of an amplitude substantially identical to the first peak.

In an optional step, not represented in FIG. 4a, the difference between the measured time-domain reflectogram and a time-domain reflectogram measured at a prior instant, for example on installation of the cable, is calculated in order to eliminate the non-uniformities present in the cable from its design. This step also allows for the tracking of the evolution of the faults affecting the cable by performing a differential analysis.

Figure 4B:
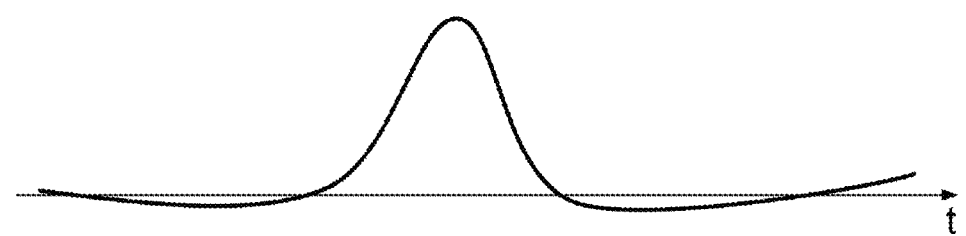

The method is continued in a second step 302 of calculating the integral INT of the reflectogram. The integral is calculated digitally, for example by calculating the sum of the samples of the reflectogram between the instant 0 and the current instant t. An example of result of calculation of the integral INT of the reflectogram of FIG. 4a is represented in FIG. 4b. It will be noted that, after calculation of the integral, the two peaks of reversed signs characteristic of a soft fault are converted into a single peak of twice the duration of the duration of each of the two peaks of the signature of the fault in the reflectogram.

The invention aims to exploit the characteristic form of the signature of a soft fault, after calculation of the integral of the reflectogram, by searching for this form in order to locate a soft fault accurately.

For that, the next steps 303, 304, 305, 306, 307 can be iterated for all the samples of the integral INT of the reflectogram in order to search for the presence of a soft fault over all the length of the cable. Alternatively, these steps can be executed only for a given time interval of the integral INT of the reflectogram, for example an interval corresponding to an area of the cable in which a fault has been pre-located.

The step 303 consists in selecting three samples P1, P2, P3 of the integral INT which are spaced apart respectively by a duration k1 and by a duration k2 as illustrated in FIG.

Figure 4C:
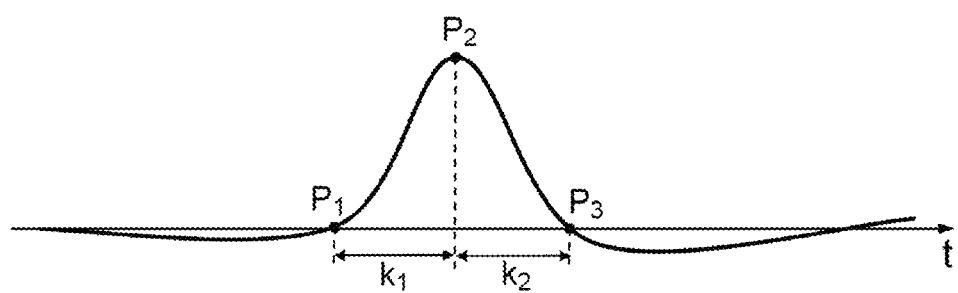

4c. The durations k1 and k2 are parameters of the invention and are set once and for all for the processing of all of the reflectogram. Thus, the three points P1, P2, P3 can span the integral curve INT of the reflectogram, one aim of the invention being to detect the configurations for which the second point P2 coincides with the summit of the peak of the signature of a fault, while the first point P1 and the last point P3 coincide respectively with the start and the end of the peak. This configuration is represented in FIG. 4c. It should be noted that the amplitude peak characteristic of the presence of a soft fault in the integral INT of the reflectogram can also be of negative sign (configuration opposite to that of FIG. 4c).

The durations k1 and k2 are determined in such a way that the delay between the last point P3 and the first point P1 is substantially equal to the duration of the signature of a fault that is to be detected, in the interval of the reflectogram.

In the case where the reference signal used is a time-domain pulse, the durations k1 and k2 are determined as a function of the duration of the pulse of the reference signal injected into the cable or else of the frequency of this signal. In this case, the total duration k1+k2 can be chosen, for example, to be equal to twice the duration of the pulse of the reference signal injected into the cable or of the pulse associated with the first mismatch peak on the point of injection of the cable in the reflectogram.

In the more general case where the reference signal used has any form, the total duration k1+k2 can be determined by measuring the width of the first mismatch peak in the reflectogram obtained after cross-correlation between the reference signal and the measured reflected signal.

One possible embodiment of the invention consists in choosing k1=k2 to search for amplitude peaks of symmetrical form.

In a variant embodiment, the duration k2 can be taken to be equal to a value greater than that of the duration k1 in order to take into account the dispersion phenomena, which occur in particular at high frequencies, to detect faults situated at a great distance from the injection point. Indeed, the symmetry of the double pulse, characteristic of the signature of a soft fault in a reflectogram, can be distorted by virtue of the potential variability of the speed of propagation of the signal as a function of frequency.

In a step 304, a first difference in absolute value between the second sample P2 and the first sample P1 is calculated. Alternatively, the first sample P1 can be replaced by the third sample P3.

In a step 305, a second difference in absolute value between the third sample P3 and the first sample P1 is also calculated.

The method continues with two comparison steps 306, 307.

The first step 306 consists in comparing the first difference calculated in the step 304 to a parameterizable detection threshold α. This test makes it possible to discriminate a soft fault from a simple noise-linked measurement artefact. The detection threshold α depends on the severity of the fault whose detection is sought and on the signal-to-noise ratio on the measurement. The first difference |P2−P1| (or |P2−P3|) gives information on the amplitude of the peak characteristic of a soft fault in the integral INT of the reflectogram.

If the first difference is less than the detection threshold α, the method concludes on the absence of fault at the point of the cable corresponding to the time-domain abscissa of the second point P2 selected. It is recalled here that there is a direct correlation between the time-domain abscissae of the points of a reflectogram (or of the integral of a reflectogram) and the distance between the point of injection of the reference signal and a point of the cable. The two items of information are linked by the relationship d=V·t where V is the speed of propagation of the signal in the cable, d is the distance between the point of injection and a point of the cable and t is the time-domain abscissa of a point of the reflectogram.

Conversely, if the first difference is greater than or equal to the detection threshold α, then the method goes on to a second comparison step 307. In this step 307, the first difference calculated in the step 304 is compared with the second difference calculated in the step 305 and multiplied by a weighting coefficient β. This second test makes it possible to detect the form of the signature of a soft fault in the integral INT of the reflectogram. The weighting coefficient β depends on the form of the pulse characteristic of a soft fault in the integral INT of the reflectogram. The value of this weighting coefficient is set by trial and error. A preferred value of this coefficient, obtained by trial and error, lies within the interval [3; 9]. The comparison of the first difference |P2−P1| (or |P2−P3|) with the second difference |P3−P1| weighted by a coefficient β makes it possible to characterize the form of the pulse.

If the first difference is less than the second difference weighted by the coefficient β, then the method concludes on the absence of fault at the point of the cable corresponding to the time-domain abscissa of the second point P2 selected.

Conversely, if the first difference is greater than or equal to the second difference weighted by the coefficient β, then the method concludes on the presence of a soft fault at the point of the cable corresponding to the time-domain abscissa of the second point $P_2$ selected.

The test steps 306 and 307 can be executed in the order indicated above or in the reverse order, that is to say by first applying the test 307 with respect to the coefficient β then the test 306 associated with the detection threshold α.

According to a particular variant embodiment of the invention, the first test step 306 can be made optional, the method according to the invention then including only the test step 307.

The invention offers the advantage of being not difficult to implement because it requires only simple calculations (addition, subtraction and comparison). It can thus be easily embedded in a portable wired diagnostic equipment item. Furthermore, the invention makes it possible to accurately locate a soft fault by searching for the summit of the amplitude peak characteristic of the signature of such a fault in the range of the integral of the reflectogram.

The invention can be applied to any type of signal compatible with reflectometry diagnostics and to any type of cable for which the problem of detection of superficial faults exists.

Figure 5:
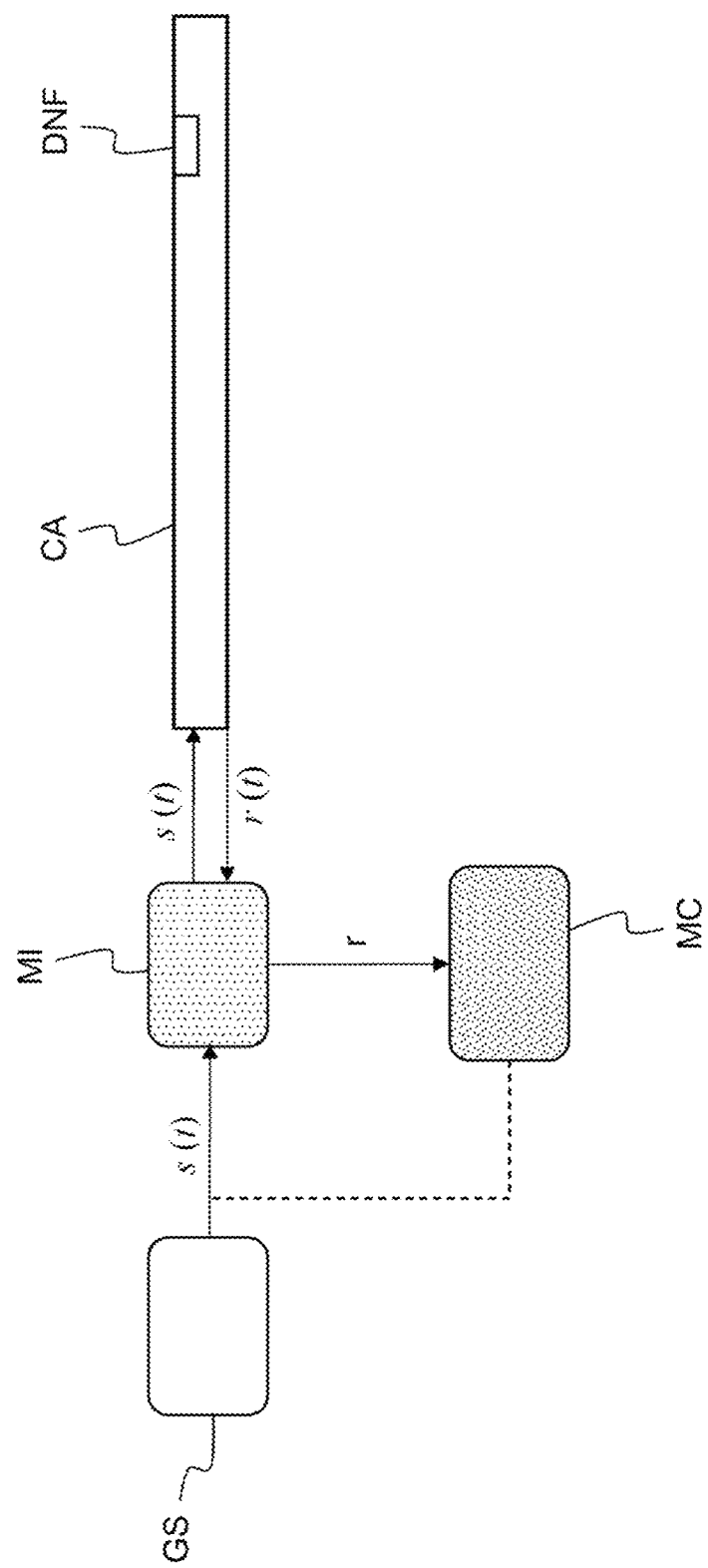

FIG. 5 schematically represents, by a block diagram, an example of reflectometry system capable of implementing the method according to the invention.

A reflectometry system, or reflectometer, comprises at least one signal generator GS, for generating a test signal s and injecting it into the cable to be analyzed CA which comprises a soft fault DNF, a measurement equipment item MI for measuring the reflected signal r in the cable CA and an electronic component MC of integrated circuit type, such as a programmable logic circuit, for example of FPGA type or a microcontroller, for example a digital signal processor, which receives the measurement of the reflected signal r(t) and is configured to execute the method according to the invention in order to detect and locate one or more soft faults. The electronic component MC can also comprise both an integrated circuit, for example to perform the acquisition of the reflected signal, and a microcontroller for executing the processing steps required by the invention.

The injection of the test signal s into the cable can be performed by a coupling device (not represented in FIG. 5) which can be a coupler with capacitive or inductive effect or even using an ohmic connection. The coupling device can be produced by physical connectors which link the signal generator to the cable or by contactless means, for example by using a metal cylinder whose internal diameter is substantially equal to the outer diameter of the cable and which produces an effect of capacitive coupling with the cable.

The acquisition of the reflected signal in the cable can also be performed by means of a coupling device of the type described previously.

The reflectometry system can also comprise a digital-analog converter arranged between the test signal generator, in the case where it is a digital signal, and the injection coupler.

The reflectometry system can also comprise an analog-digital converter arranged between the reflected signal measurement coupler and the measurement equipment item MI or the electronic component MC for the purposes of digitizing the measured analog signal.

Furthermore, a processing unit (not represented in FIG. 5), of computer, personal digital assistant or other type is used to drive the reflectometry system according to the invention and display the results of the measurements on a human-machine interface.

The results displayed can comprise one or more reflectograms calculated using the method according to the invention and/or information concerning the existence and the location of a fault on the cable also produced by the method according to the invention.

According to a particular embodiment, the test signal s injected can also be supplied to the component MC when the processing functions performed require the knowledge of the injected signal, particularly when the latter include a step of cross-correlation between the test signal s and the reflected signal r.

The injection of the signal into the cable and the measurement of the reflected signal can be performed by one and the same component but also by two distinct components, particularly when the injection point and the measurement point are dissociated.

The system described in FIG. 5 can be implemented by an electronic board on which the various components are arranged. The board can be connected to the cable by a coupler.

Furthermore, a processing unit, of computer or personal digital assistant type, or another equivalent electronic or computing device can be used to drive the reflectometry device and display the results of the calculations performed by the component MC on a human-machine interface, in particular the information on detection and location of faults on the cable.

The method according to the invention can be implemented on the component MC based on hardware and/or software elements.

The method according to the invention can be implemented directly by an embedded processor or in a specific device. The processor can be a generic processor, a specific processor, an application-specific integrated circuit (also known by the acronym ASIC) or a field-programmable gate array (also known by the acronym FPGA). The device according to the invention can use one or more dedicated electronic circuits or a general-purpose circuit. The technique of the invention can be carried out on a reprogrammable computation machine (a processor or a microcontroller for example) running a program comprising a sequence of instructions, or on a dedicated computation machine (for example a set of logic gates such as an FPGA or an ASIC, or any other hardware module).

The method according to the invention can also be implemented exclusively as computer program, the method being then applied to a reflectometry measurement r previously acquired using a standard reflectometry device. In such a case, the invention can be implemented as computer program comprising instructions for the execution thereof. The computer program can be stored on a processor-readable storage medium.

The reference to a computer program which, when it is run, performs any of the functions described previously, is not limited to an application program running on a single host computer. On the contrary, the terms computer program and software are used here in a general sense to refer to any type of computing code (for example, application software, firmware, microcode or any other form of computer instruction) which can be used to program one or more processors to implement aspects of the techniques described here. The computing means or resources can in particular be distributed (Cloud computing), possibly according to peer-to-peer technologies. The software code can be executed on any appropriate processor (for example, a microprocessor) or processor core or a set of processors, whether provided in a single computation device or distributed between several computation devices (for example as possibly accessible in the environment of the device). The executable code of each program allowing the programmable device to implement the processes according to the invention can be stored, for example, in the hard disk or in read-only memory. Generally, the program or programs will be able to be loaded into one of the storage means of the device before being executed. The central processing unit can control and direct the execution of the instructions or software code portions of the program or programs according to the invention, instructions which are stored in the hard disk or in the read-only memory or else in the abovementioned other storage elements.

The invention claimed is:

1. A method for detecting soft faults in a transmission line comprising the steps of:
    acquiring a measurement signal, called time-domain reflectogram, characteristic of the reflection of a reference signal previously injected into the line,
    calculating the integral of the time-domain reflectogram,
    selecting, from the samples of the integral of the time-domain reflectogram, a first sample $P_1$, a second sample $P_2$, delayed by a first delay $k_1$ relative to the first sample $P_1$ and a third sample $P_3$, delayed by a second delay $k_2$ relative to the second sample $P_2$,
    calculating a first distance equal to the difference in absolute value between the value of the second sample $P_2$ and the value of either one of the first sample $P_1$ or of the third sample $P_3$,
    calculating a second distance equal to the difference in absolute value between the value of the first sample $P_1$ and of the third sample $P_3$,
    performing a first comparison of the first distance to the second distance weighted by a weighting coefficient $\beta$,
    deducing from the result of the first comparison information on the existence of a soft fault at a position of the transmission line corresponding to the time-domain abscissa of the second sample $P_2$.

2. The method for detecting soft faults in a transmission line of claim 1, further comprising the steps of:
   performing a second comparison of the first distance to a detection threshold $\alpha$,
   deducing from the result of the first comparison and of the second comparison information on the existence of the soft fault at a position of the transmission line corresponding to the time-domain abscissa of the second sample $P_2$.

3. The method for detecting soft faults in a transmission line of claim 1, wherein the first delay $k_1$ and the second delay $k_2$ are determined at least as a function of the width of a first mismatch peak measured on the time-domain reflectogram.

4. The method for detecting soft faults in a transmission line of claim 1, wherein the method is iterated by varying the first sample $P_1$ over a plurality of samples of the integral of the time-domain reflectogram by retaining the values of the first delay $k_1$ and of the second delay $k_2$ that are fixed during the iterations.

5. The method for detecting soft faults in a transmission line of claim 1, wherein the first delay $k_1$ is equal to the second delay $k_2$.

6. The method for detecting soft faults in a transmission line of claim 2, wherein the detection threshold $\alpha$ is configured at least as a function of a parameter out of a signal-to-noise ratio on the measurement signal and the severity of a targeted soft fault.

7. The method for detecting soft faults in a transmission line of claim 1, wherein the value of the weighting coefficient $\beta$ is taken from the interval [3; 9].

8. The method for detecting soft faults in a transmission line of claim 1, wherein the time-domain reflectogram is replaced by the cross-correlation between the measurement signal and the reference signal.

9. The method for detecting soft faults in a transmission line of claim 2, comprising a diagnostic step of concluding on the presence of the soft fault at a position of the transmission line corresponding to the time-domain abscissa of the second sample $P_2$ if the first distance is greater than the detection threshold $\alpha$ and if the first distance is greater than the second distance weighted by the weighting coefficient $\beta$.

10. The method for detecting soft faults in a transmission line of claim 2, comprising a diagnostic step of concluding on the absence of the soft fault at a position of the transmission line corresponding to the time-domain abscissa of the second sample $P_2$ if the first distance is less than the detection threshold $\alpha$ and if the first distance is less than the second distance weighted by the weighting coefficient $\beta$.

11. A device for detecting soft faults in a transmission line comprising an apparatus for measuring, at a point of the transmission line, a signal back-propagated in the transmission line and a computer configured to execute a method for detecting soft faults in a transmission line comprising the steps of:
   acquiring a measurement signal, called time-domain reflectogram, characteristic of the reflection of a reference signal previously injected into the line,
   calculating the integral of the time-domain reflectogram,
   selecting, from the samples of the integral of the time-domain reflectogram, a first sample $P_1$, a second sample $P_2$, delayed by a first delay $k_1$ relative to the first sample $P_1$ and a third sample $P_3$, delayed by a second delay $k_2$ relative to the second sample $P_2$,
   calculating a first distance equal to the difference in absolute value between the value of the second sample $P_2$ and the value of either one of the first sample $P_1$ or of the third sample $P_3$,
   calculating a second distance equal to the difference in absolute value between the value of the first sample $P_1$ and of the third sample $P_3$,
   performing a first comparison of the first distance to the second distance weighted by a weighting coefficient $\beta$,
   deducing from the result of the first comparison information on the existence of a soft fault at a position of the transmission line corresponding to the time-domain abscissa of the second sample $P_2$.

12. A reflectometry system comprising a device for injecting, at a point of the transmission line, a reference signal, and a device for detecting soft faults in a transmission line as claimed in claim 11.

13. A computer program comprising instructions stored on a tangible non-transitory storage medium for executing on a processor executing a method for detecting soft faults in a transmission line comprising the steps of:
   acquiring a measurement signal, called time-domain reflectogram, characteristic of the reflection of a reference signal previously injected into the line,
   calculating the integral of the time-domain reflectogram,
   selecting, from the samples of the integral of the time-domain reflectogram, a first sample $P_1$, a second sample $P_2$, delayed by a first delay $k_1$ relative to the first sample $P_1$ and a third sample $P_3$, delayed by a second delay $k_2$ relative to the second sample $P_2$,
   calculating a first distance equal to the difference in absolute value between the value of the second sample $P_2$ and the value of either one of the first sample $P_1$ or of the third sample $P_3$,
   calculating a second distance equal to the difference in absolute value between the value of the first sample $P_1$ and of the third sample $P_3$,
   performing a first comparison of the first distance to the second distance weighted by a weighting coefficient $\beta$,
   deducing from the result of the first comparison information on the existence of a soft fault at a position of the transmission line corresponding to the time-domain abscissa of the second sample $P_2$.

14. A tangible non-transitory processor-readable recording medium on which is stored a program comprising instructions for executing a method for detecting soft faults in a transmission line comprising the steps of:
   acquiring a measurement signal, called time-domain reflectogram, characteristic of the reflection of a reference signal previously injected into the line,
   calculating the integral of the time-domain reflectogram,
   selecting, from the samples of the integral of the time-domain reflectogram, a first sample $P_1$, a second sample $P_2$, delayed by a first delay $k_1$ relative to the first sample $P_1$ and a third sample $P_3$, delayed by a second delay $k_2$ relative to the second sample $P_2$,
   calculating a first distance equal to the difference in absolute value between the value of the second sample $P_2$ and the value of either one of the first sample $P_1$ or of the third sample $P_3$,
   calculating a second distance equal to the difference in absolute value between the value of the first sample $P_1$ and of the third sample $P_3$,
   performing a first comparison of the first distance to the second distance weighted by a weighting coefficient $\beta$,
   deducing from the result of the first comparison information on the existence of a soft fault at a position of the transmission line corresponding to the time-domain abscissa of the second sample $P_2$.

\* \* \* \* \*